(12) United States Patent
Nishikawa (10) Patent No.: US 6,486,689 B1
(45) Date of Patent: Nov. 26, 2002

(54) PRINTED CIRCUIT BOARD TESTING APPARATUS AND PROBE DEVICE FOR USE IN THE SAME

(75) Inventor: Hideo Nishikawa, Kyoto (JP)

(73) Assignee: Nidec-Read Corporation, Uji (JP)

( * ) Notice: Subject to any disclaimer, the term of this patent is extended or adjusted under 35 U.S.C. 154(b) by 0 days.

(21) Appl. No.: 09/579,019

(22) Filed: May 26, 2000

(30) Foreign Application Priority Data

May 26, 1999 (JP) .......................................... 11-146123

(51) Int. Cl.[7] ............................................... G01R 31/02
(52) U.S. Cl. ....................... 324/761; 324/754; 324/755
(58) Field of Search ................................. 324/754, 755, 324/756, 158.1, 72.5, 133, 149, 761, 762; 439/482, 912

(56) References Cited

U.S. PATENT DOCUMENTS

| | | | |
|---|---|---|---|
| 4,506,215 A | 3/1985 | Coughlin | 324/158 |
| 5,923,178 A * | 7/1999 | Higgins et al. | 324/754 |
| 6,020,747 A * | 2/2000 | Bahns et al. | 324/754 |

FOREIGN PATENT DOCUMENTS

| | | |
|---|---|---|
| JP | 64-25087 A | 1/1989 |
| JP | 64-35382 A | 2/1989 |
| JP | 2-63538 U | 5/1990 |
| JP | 6186271 | 7/1994 |
| JP | 9-15302 A | 1/1997 |
| JP | 9113536 | 5/1997 |
| JP | 9-113537 A | 5/1997 |
| JP | 9178771 | 7/1997 |
| JP | 10-282140 A | 10/1998 |

\* cited by examiner

*Primary Examiner*—Michael Sherry
*Assistant Examiner*—Paresh Patel
(74) *Attorney, Agent, or Firm*—Smith Patent Office (57) ABSTRACT

A probe device is mounted on a circuit provided with a holder mountable to a circuit board testing apparatus, a contact needle attachable to the holder. The contact needle is operable to resiliently bend in a specified direction immediately after coming into contact with a circuit board. The bending absorbs a contact impact to ensure accurate measurement.

6 Claims, 8 Drawing Sheets

PRINTED CIRCUIT BOARD TESTING APPARATUS AND PROBE DEVICE FOR USE IN THE SAME

This application is based on patent application No. 11-146123 filed in Japan, the contents of which is hereby incorporated by reference.

BACKGROUND OF THE INVENTION

1. Field of the Invention

This invention relates to a printed circuit board testing apparatus for testing an open circuit and current leakage or conductivity of a circuit pattern formed on a printed circuit board, and a probe device for use in such an apparatus.

2. Discussion of the Related Art

There has been a circuit board testing apparatus which tests an open circuit and current leakage or conductivity of a circuit pattern formed on a printed circuit board by rendering a single contact needle or a number of contact needles of a probe device to come into contact with a specified position of the circuit pattern formed on the circuit board as shown in Japanese Unexamined Patent Publication No.6-186271. However, there has been a problem that when the contact needle comes into contact with the circuit pattern, the circuit pattern receives a considerable impact and a noticeable stress occurs in the contact needle, resulting in an incorrect measurement. To solve this problem, accordingly, some technologies have been proposed.

Japanese Unexamined Patent Publication No. 9-178771 discloses a probe device in which a contact needle is moved or shifted to a position near the circuit pattern at a high speed, and the contact needle is then moved to the circuit pattern at a slow speed so as to assure a soft contact. Also, Japanese Unexamined Patent Publication No. 9-113536 discloses a probe device provided with a coil spring on an upper portion of a contact needle to absorb an impact at contact.

However, these probe devices have the following drawbacks. The probe device featuring the speed change requires an increased measurement time or testing time to assure a soft contact. The probe device featuring the coil spring cannot suppress the stress on the contact needle sufficiently. Further, the contact needle of these probe devices suffers considerable abrasion, and has some likelihood of breaking.

SUMMARY OF THE INVENTION

It is an object of the present invention to provide a circuit board testing apparatus and a probe device which are free from the problems residing in the prior art.

According to an aspect of the invention, a probe device comprises a holder mountable to a circuit board testing apparatus, and a contact needle attachable to the holder. The contact needle is operable to resiliently bend in a specified direction immediately after coming into contact with a circuit board.

According to another aspect of the invention, a circuit board testing apparatus comprises a table for supporting a circuit board to be tested, and a tester unit carrying a plurality of probe devices. Each probe device is provided with a holder mountable to a main body of the test unit, and a contact needle attachable to the holder, and operable to resiliently bend in a specified direction immediately after coming into contact with the circuit board.

These and other objects, features and advantages of the present invention will become more apparent upon a reading of the following detailed description and accompanying drawings.

DETAILED DESCRIPTION OF THE PREFERRED EMBODIMENTS

Figure 1:
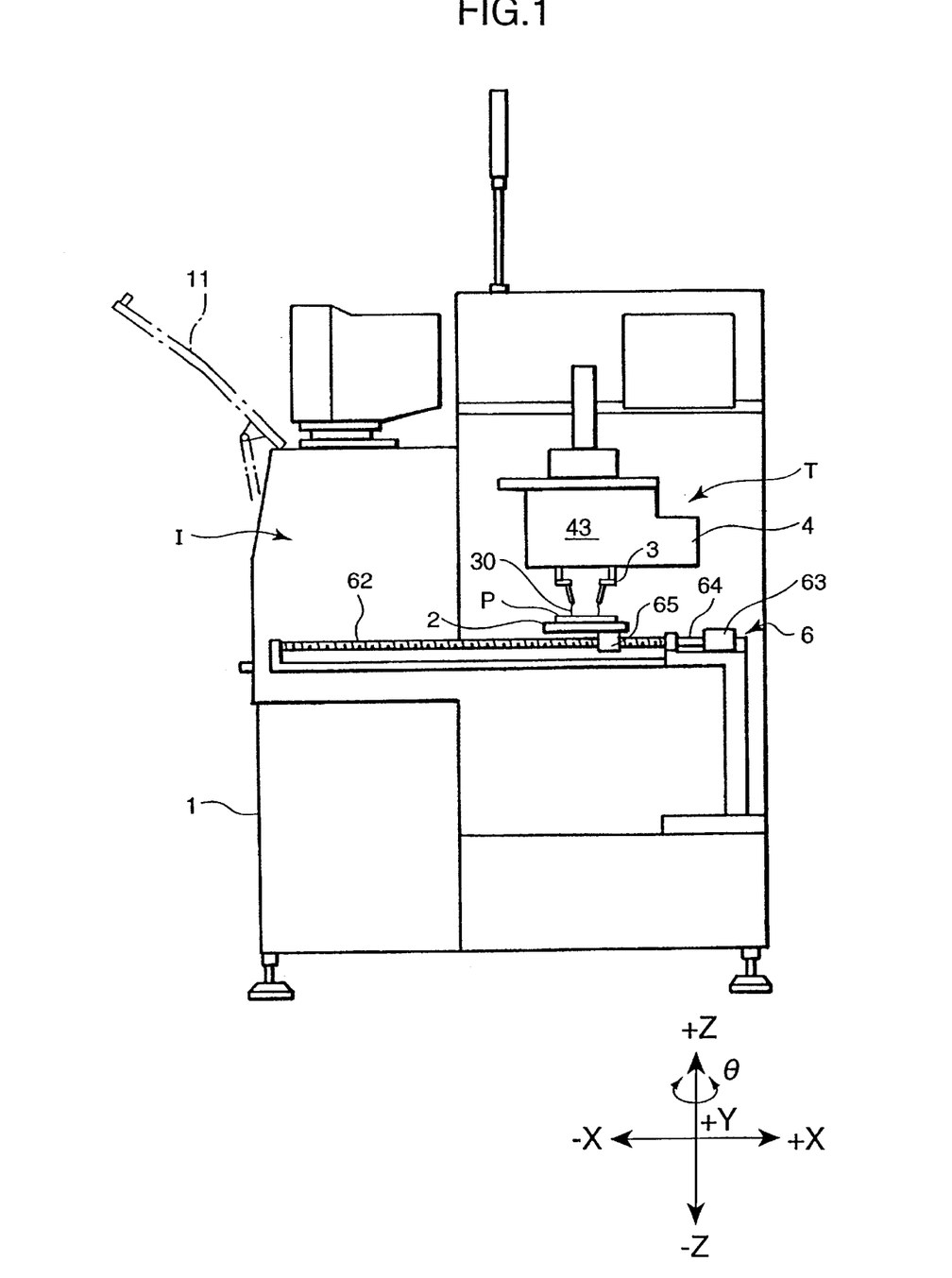
FIG. 1 is a schematic diagram showing an entire construction of a circuit board testing apparatus embodying the present invention.

FIG. 1 shows a schematic side view of a circuit board testing apparatus according to an embodiment of the invention. In order to clarify directions of movement and the relative positions of the parts of the apparatus in the drawings, X, Y and Z axes of rectangular coordinates are shown.

The circuit board testing apparatus includes a door 11 provided on the front (−X side) of a main body 1 of the apparatus. The door 11 is opened to place a printed circuit board P to be tested on a transfer table 2. The printed circuit board to be tested may be a bare printed circuit board on which an electric circuit pattern is printed but circuit elements such as IC chips, capacitors, resistors have not been mounted. The circuit board P is tested or inspected in a test section T. A signal representing the conductivity between points on the circuit pattern of the circuit board P is picked up or detected to evaluate the circuit board P to accept or deny. The tested circuit board P is returned to an initial position I where the tested circuit board P is in turn taken out through the front opening by the operator.

The transfer table 2 is reciprocatively moved in X-directions between the initial position I and the test section T by a transfer table drive mechanism 6. The transfer table drive mechanism 6 includes a ball screw 62, a drive shaft 64, and a motor 63. The ball screw 62 threads through a bracket 65 fixedly attached on the transfer table 2. The ball screw 62 and the bracket 65 are mechanically associated with each other. The movement of the transfer table 2 corresponds to the rotation of the motor 63.

In the test section T, there is provided a tester unit 4 over the transfer table drive mechanism 6. The tester unit 4 carries a plurality of probe devices 3. Each probe device is provided with a contact needle 30. The plurality of probe devices 3 are individually driven by a probe device drive mechanism 43 which is controlled by a controller. After being positioned relative to the circuit board P on the transfer table 2, the probe devices 3 are driven to bring their respective contact needles 30 into contact with the circuit pattern on the circuit board P.

The probe device drive mechanism 43 is provided with X-, Y-, and Z-drive sections for moving the probe devices 3 in the X-, Y-, and Z- directions with respect to the main body 1, whereby the contact needle 30 of the probe device 3 are moved to and away from the circuit pattern formed on the circuit board P.

Figure 2:
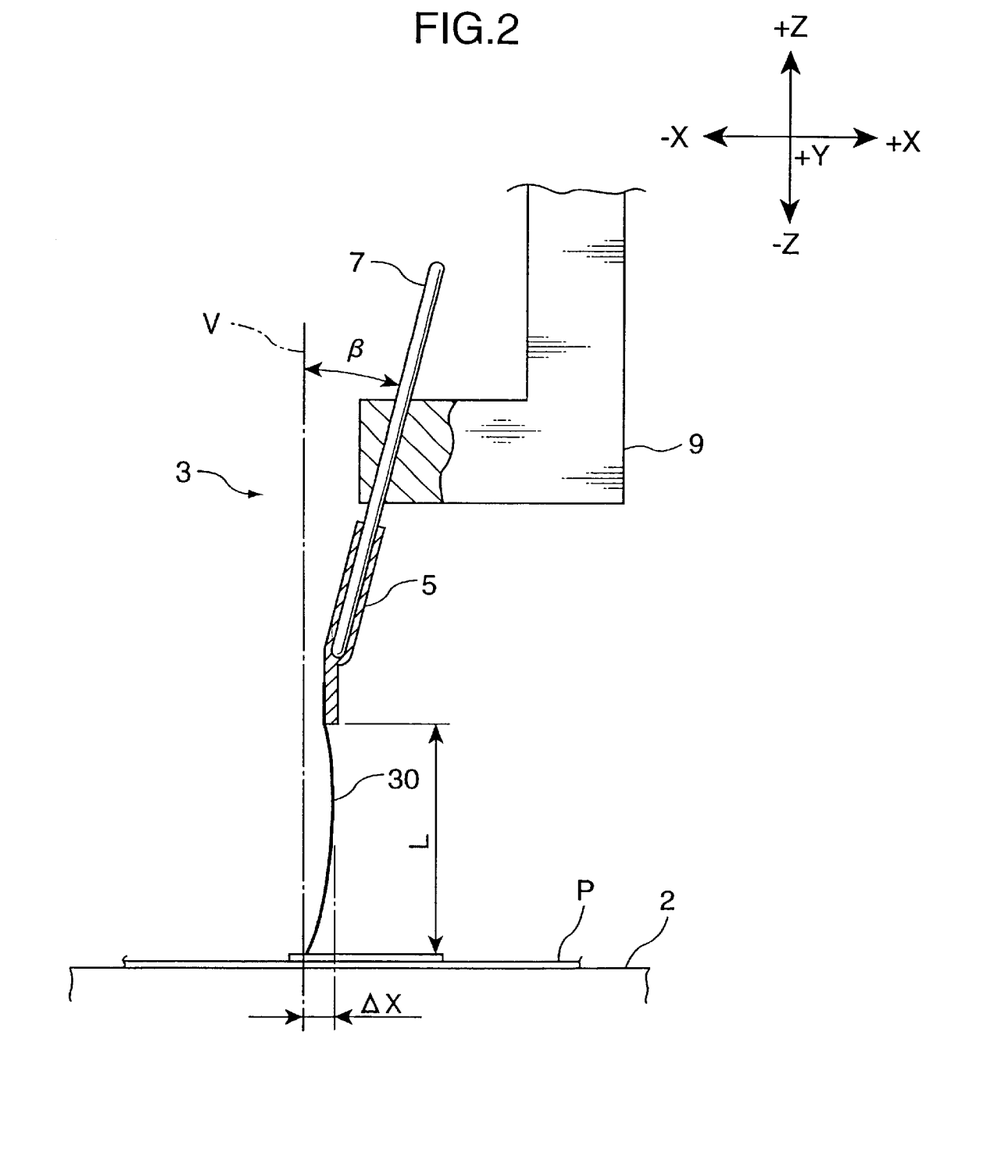
FIG. 2 is a partial sectional view showing a construction of a probe device provided in the circuit board testing apparatus.

Referring to FIG. 2 showing a construction of one probe device 3, the probe device 3 includes an L-shaped holding member 9 mechanically connected with the drive mechanism 43, an electrode rod 7 fixedly mounted on the holding member 9, a socket 5 removably attached on the electrode rod 7, and a contact needle 30 fixedly attached on the socket 5. The holding member 9 is made of an electrical insulating material. However, the contact needle 30, the socket 5, and the electrode rod 7 each are made of an electrically conductive material. The electrode rod 7 is connected with a connecting wire for measurement. However, the connecting wire is not shown in the drawing for clarity. The electrode rod 7 is inclined at β, e.g., 15 degrees, with respect to a vertical direction V. The contact needle 30 is fixedly attached on the socket 5 by caulking or solder.

The contact needle 30 is made of tool steel or SK steel specified by JIS (Japanese Industrial Standard), phosphor bronze, or brass. Also, the contact needle 30 may be made of other resilient materials. The contact needle 30 has a diameter of 150 μm in this embodiment. Also, the contact needle 30 is curved in a specified direction (+X direction in FIG. 2) with respect to the extending direction of the electrode rod 7. Specifically, in the case that the contact needle 30 has a straight length L of 25 mm, the maximum gap ΔX of the curved contact needle 30 is 1 mm.

Figure 3:
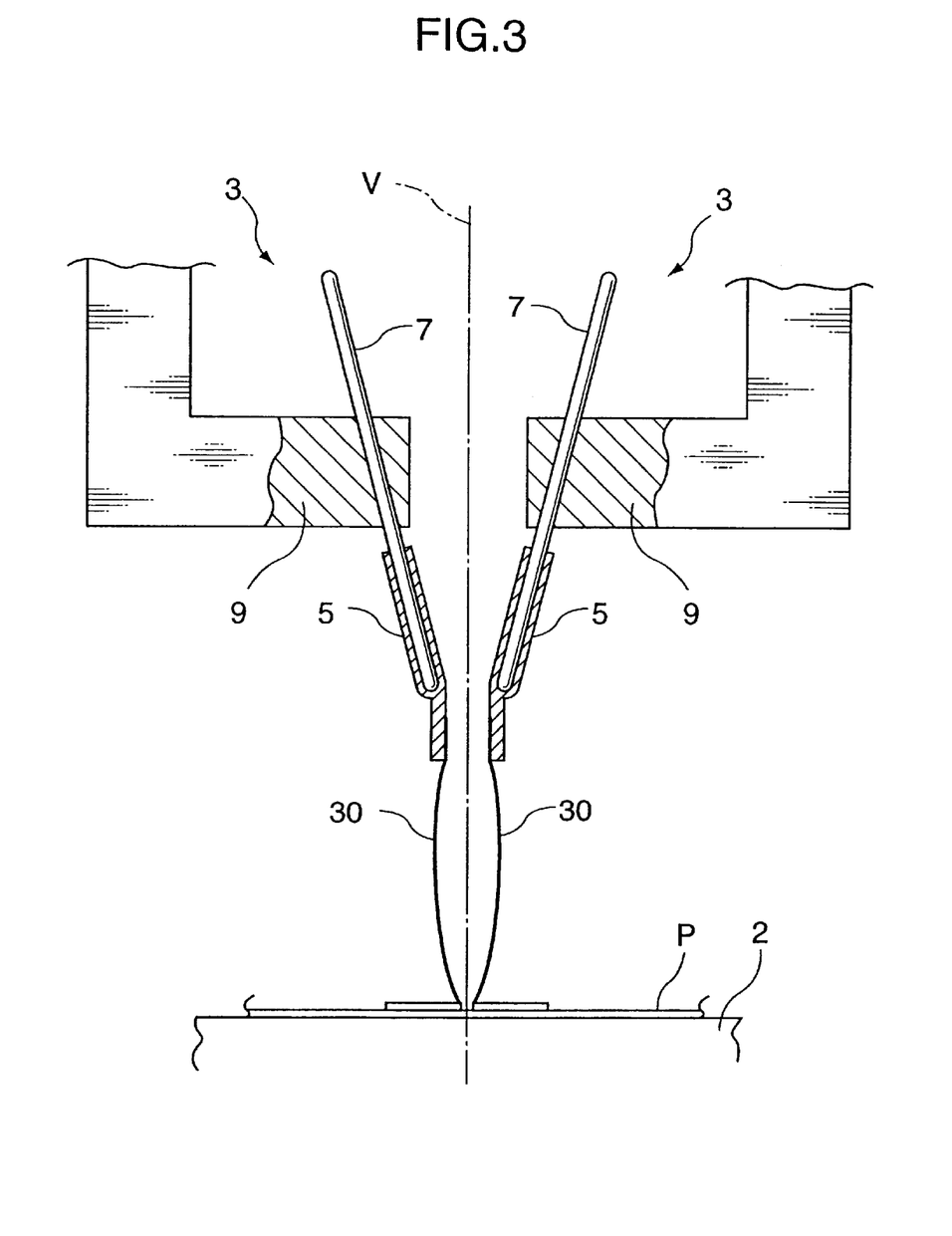
FIG. 3 is a partial view showing two probe devices close to each other.

FIG. 3 shows a state that two probe devices 3 are moved closer to each other to test the conductivity of a small spaced circuit pattern portion. Even when the probe devices 3 are moved closer, their respective holding members 9 do not come into contact with each other because their respective contact needles 30 are mounted on the inclined electrodes 7.

Figure 4:
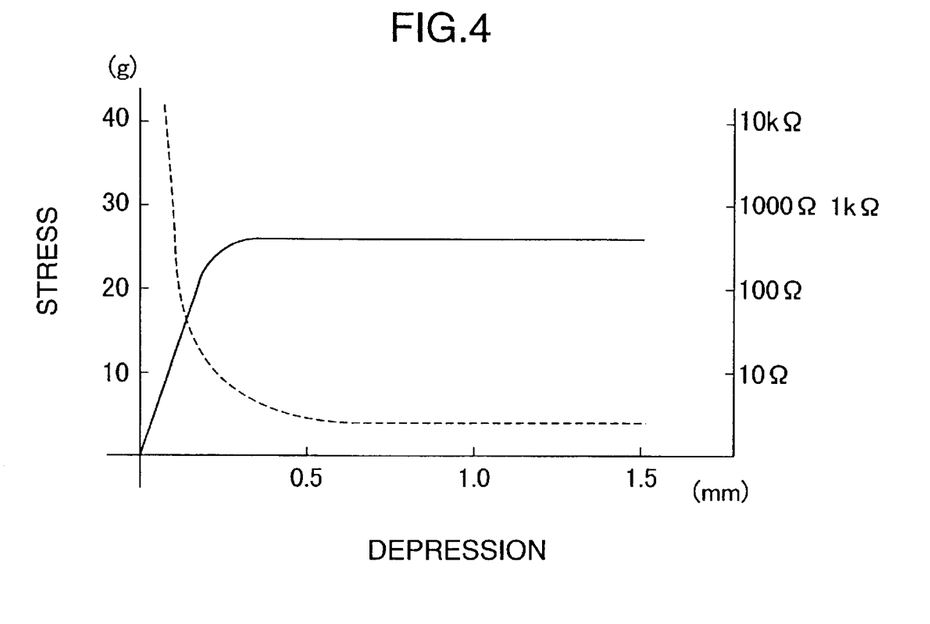
FIG. 4 is a graph showing a toughness characteristic of a contact needle used in the probe device.

FIG. 4 shows a toughness characteristic of a needle made of phosphor bronze, and having a length of 30 mm and a diameter of 150 μm. The toughness characteristic of the needle was measured by depressing the needle along the lengthwise direction. This needle is useable as a contact needle 30 of this embodiment. As seen in FIG. 4, the stress does not increase beyond a certain degree of stress, i.e., 25 g with a depression of 0.3 mm even if the depression is increased. Also, the electrical resistance is observed to come into a constant value, i.e., 30, after the depression goes beyond a certain value, i.e., 0.5 mm.

In the contact needle 30 made of phosphor bronze, in view of the above-toughness characteristic, it is preferable to lower the probe device 3 so as to depress the contact needle 30 more than 0.5 mm because of the fact that the constant stress and the constant resistance assure reliable contact, and is attainable beyond a depression of 0.5 mm. On the other hand, a larger depression increases the probe device movement, consequently increasing the measurement time. To assure shorter measurement time, accordingly, it is preferable to reduce the depression. In the case of measuring or testing a circuit board formed with circuit patterns having a height of 0.5 mm, for example, it will be sufficient to set the depression to 1.0 mm.

Figure 5:
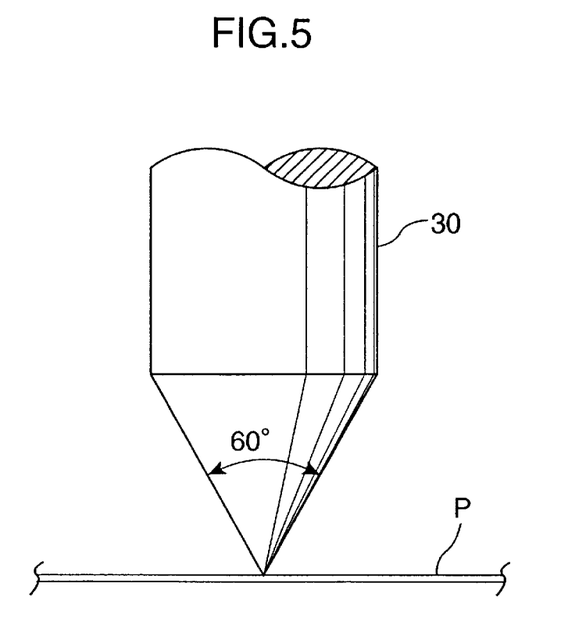
FIG. 5 is an enlarged front view showing a leading end portion of a contact needle used in the probe device.
Figure 6:
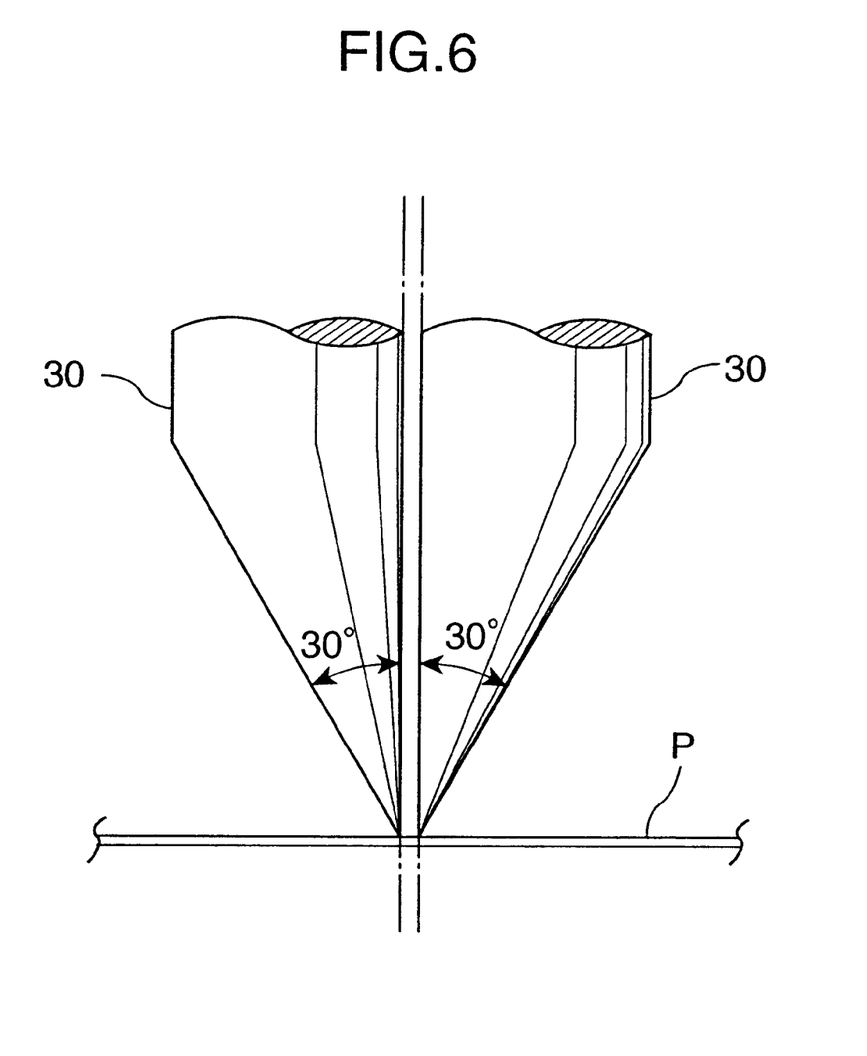
FIG. 6 is an enlarged front view showing a leading end portion of another embodiment of contact needles used in the probe device.

FIGS. 5 and 6 show the shape of a leading end or contact end of a contact needle 30. FIG. 5 shows a contact needle 30 formed with a leading end having the shape of a cone whose inclusive angle is 60 degrees. FIG. 6 shows a contact needle 30 formed with a leading end having the shape of a semi-cone whose inclusive angle is 30 degrees. The contact needle 30 shown in FIG. 5 is advantageous in testing the conductivity of a large spaced circuit pattern portion. On the hand, the contact needle 30 shown in FIG. 6 is advantageous in testing the conductivity of a small spaced circuit pattern portion as shown in FIG. 3. For example, in the case of using contact needles each having a diameter of 150 μm and a semi-conical leading end, it was confirmed that the two contact needles can be close to each other by a gap of 50 μm.

The contact needle 30, which is already curved in the specified direction or +X direction, readily curves or bends in the specified direction resiliently further when the contact needle 30 is depressed after the contact with the circuit pattern on the circuit board P. Accordingly, the further resilient bending of the contact needle 30 absorbs an impact at the contact, thereby preventing an excessive stress from occurring in the contact needle 30, and thus assuring correct measurement or test.

Also, since the contact needle 30 can absorb the impact at contact, it is not necessary to move the probe device in multiple moving speeds including a high speed for preparatory movement and a slow speed for contact movement. The contact needle 30 can assure a high speed contact because of the absorption of the contact impact by the self resilient bending, which can reduce the measurement time and the testing time remarkably.

Further in the present invention, the contact needle 30 is not provided with a coil spring to absorb contact impact. On the other hand, in the conventional contact needle provided with a coil spring, the contact needle receives an urging force of the coil spring before coming into contact with the circuit pattern. Accordingly, the conventional contact needle is forced to start the contact from some pre-stressed state. However, the contact needle 30 not provided with a coil spring receives no pressing force before coming into contact with the circuit pattern. Accordingly, the contact needle 30 starts the contact from the non pre-stressed state, thus assuring more correct measurement and testing.

Furthermore, the respective contact needles 30 of all the probe devices 3 are already curved in the predetermined directions. Accordingly, it can be eliminated that a contact needle 30 of one probe device comes into contact with another contact needle 30 of a neighboring probe device even when they are closer to one another and further bent by depression.

Figure 7:
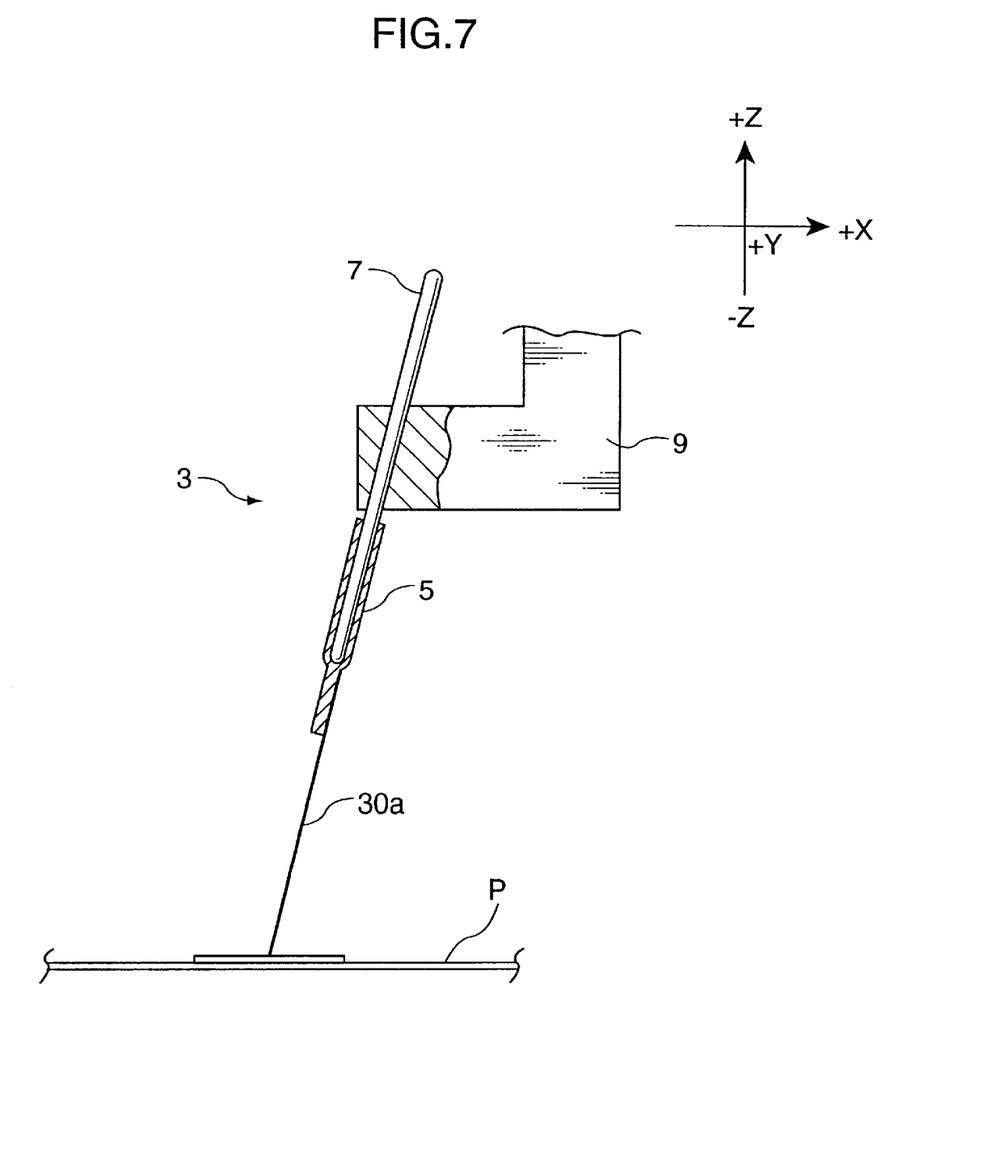
FIG. 7 is a partial sectional view showing a construction of a modified contact needle.

FIG. 7 shows a modification of the probe device which is provided with a straight contact needle 30a instead of a curved contact needle 30. In this probe device, however, the contact needle 30a is inclined with respect to the vertical direction so that the contact needle 30a resiliently bends in a specified direction or +X direction when being depressed.

Figure 8:
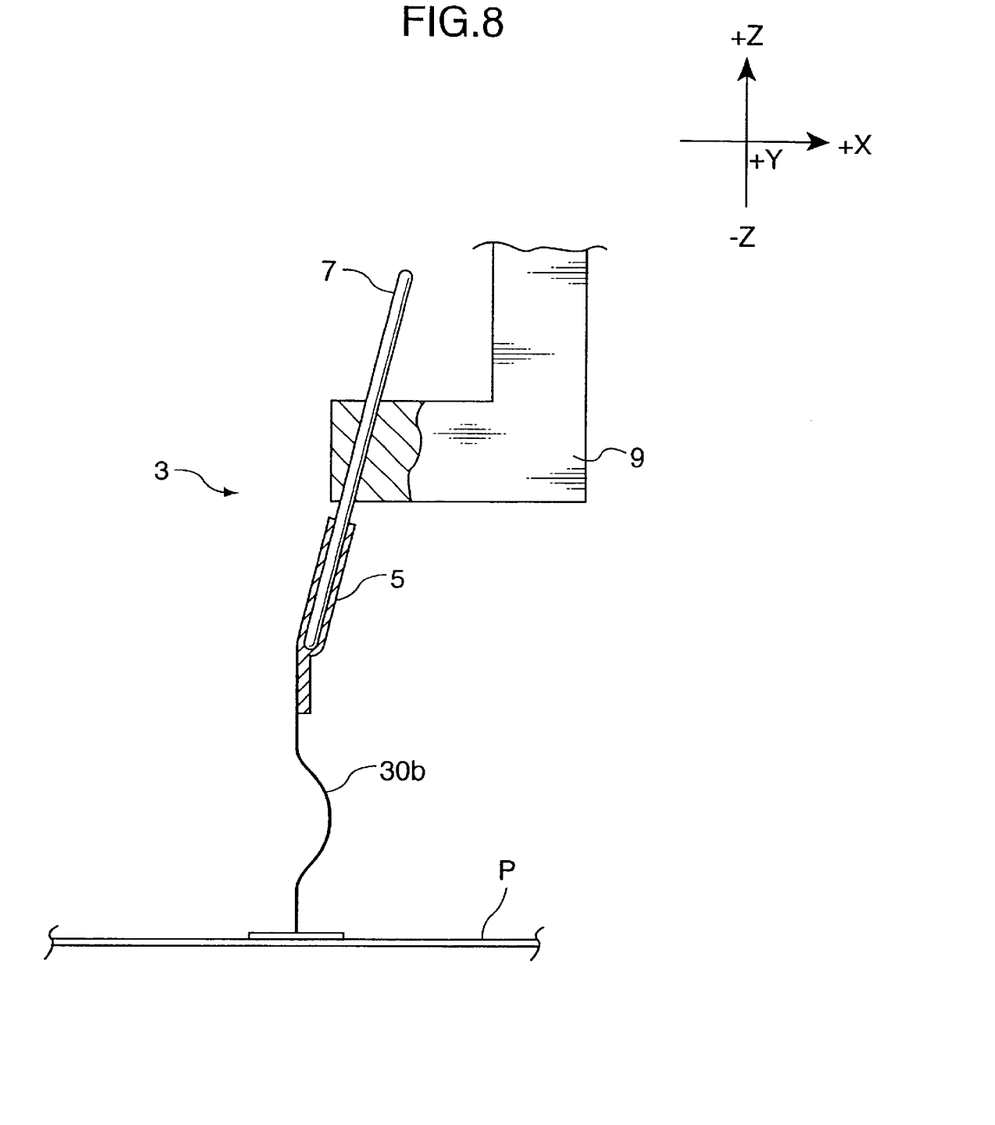
FIG. 8 is a partial sectional view showing a construction of another modified contact needle.

FIG. 8 shows another modification of the probe device which is provided with a contact needle 30b having a curved portion but generally extending in parallel with the vertical direction. The contact needle 30b has the tendency of bending +X direction at the curved portion when being depressed. This contact needle 30b can ensure an easier positioning control of the contact point.

Figure 9:
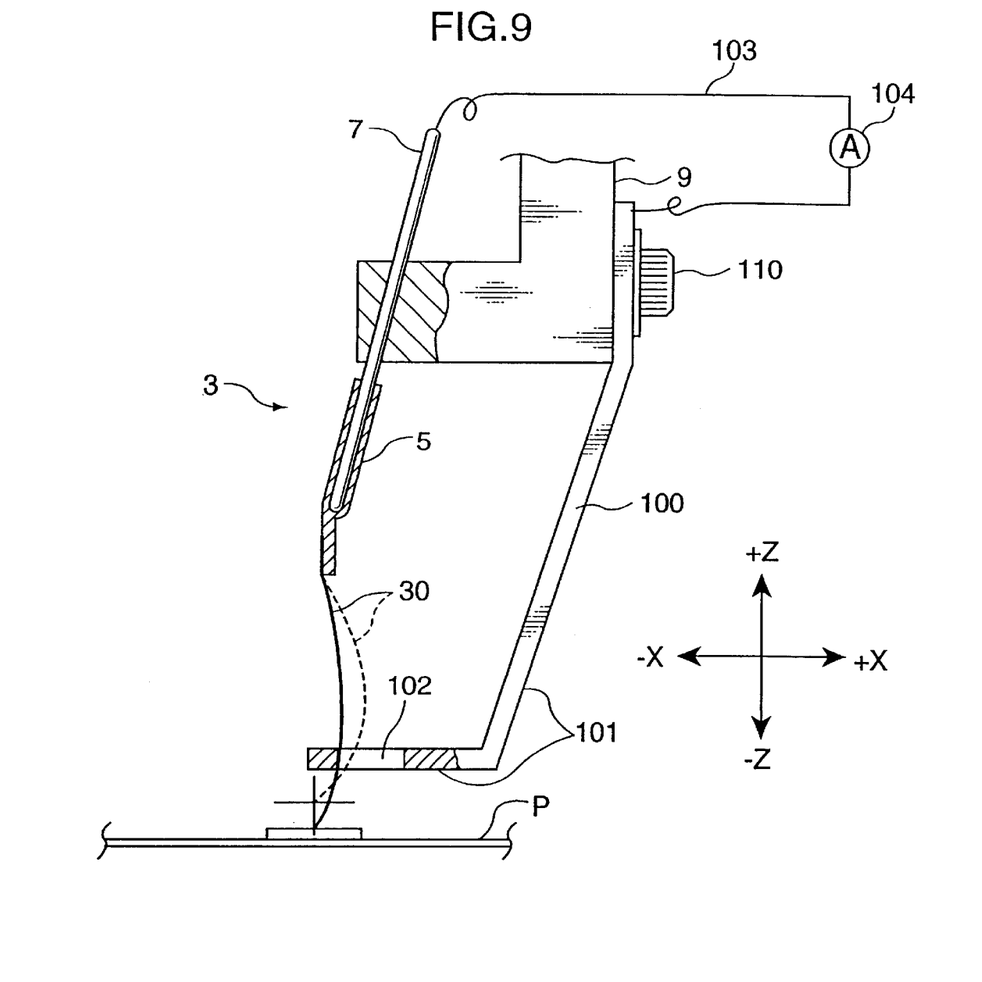
FIG. 9 is a partial sectional view showing a construction of still another modified contact needle.
Figure 10:
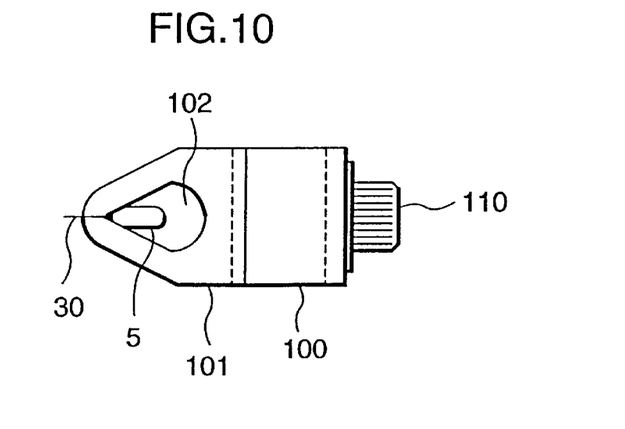
FIG. 10 is a bottom view of the modified contact needle shown in FIG. 9.

FIGS. 9 and 10 show still another modification of the probe device. This probe device 3 includes an L-shaped holding member 9 mechanically connected with a drive mechanism, an electrode rod 7 fixedly mounted on the holding member 9, a socket 5 removably attached on the electrode rod 7, a contact needle 30 fixedly attached on the socket 5, a restraining member 100 attached on the holding member 9, a connecting wire 103 electrically connecting the electrode rod 7 with the restraining member 100, and a current detector 104 provided in the connecting wire 103 for detecting an open current in the connecting wire.

The construction of the holding member 9, the electrode rod 7, the socket 5, and the contact needle 30 is identical to that of the probe device shown in FIG. 2. In this probe device, however, there are further provided the restraining member 100, the connecting wire 103, and the current detector 104. Specifically, the restraining member 100 is made of an electrical conductive material, and is attached on the holding member 9 by a screw 110. The restraining member 100 is formed with a hole 102 in a lower horizontal portion 101 thereof. The hole 102 has a generally triangular shape as shown in FIG. 10, and allows the contact needle 30 to pass therethrough.

In the state where the contact needle 30 is not depressed, the contact needle 30 comes into contact with the restraining member 100 to establish an electric circuit between the contact needle 30, socket 5, electrode rod 7, connecting wire 103, and the restraining member. When being depressed, on the other hand, the contact needle 30 resiliently bends in the +X direction and goes away from the inner wall of the hole 102 formed in the restraining member 100, consequently opening the electric circuit. The current detector 104 detects an open circuit, and then generates a signal indicative of open circuit. A controller or a calculator provided in the testing apparatus receives the signal, and thereby calculates a level of the contact needle 30.

The contact of the contact needle 30 with the circuit pattern P can be assuredly and accurately detected by checking the current flow in the connecting wire 103 by the current detector 104. This will simplify the leveling operation of a contact needle which is required at replacement of an old contact needle with a new contact needle.

Also, the contact needle 30 is kept at the vertex of the hole 102 before coming into contact with the circuit pattern P as shown in FIG. 10. Accordingly, the contact needle 30 is prevented from vibrating during the movement, consequently ensuring accurate contact and thus reliable measurement.

In the foregoing embodiment, the contact needle 30 is fixedly attached on the socket 5 by caulking or solder. The socket 5 is removably attached to the electrode rod 7 held by the holding member 9. However, it may be appreciated to attach a contact needle 30 on a holding member 9 directly. Also, a socket attached with a contact needle 30 may be directly attached on a holding member 9.

Further, in the foregoing embodiment, the probe device 3 is moved down and up while the printed circuit board P stays at a fixed position. However, it may be appreciated to move the printed circuit board P up and down while the probe device 3 stays at a fixed position, or alternatively to move the printed circuit board P and the probe device 3 relative to each other.

As described above, the inventive probe device is provided with a holder mountable to a circuit board testing apparatus, and a contact needle attachable to the holder. The contact needle is operable to resiliently bend in a specified direction immediately after coming into contact with a circuit board. The contact needle bends immediately after coming into contact with the circuit board, thereby absorbing an impact at contact. Accordingly, the open circuit and current leakage or conductivity of a circuit pattern formed on the printed circuit board can be accurately tested in a shorter time.

The holder may comprise by a holding member made of an electrically insulating material, an electrode rod mounted in the holding member, and a socket removably attached on the electrode rod. In this case, the contact needle is fixedly attached on the socket. This construction makes it easier to interchange contact needles.

The electrode rod may be made to extend in an inclined direction with respect to a normal line of the circuit board to thereby arrange two or more contact needles closer to each other.

The probe device may be further provided with a restraining member for restraining the contact needle. This will prevent the contact needle from vibrating during the movement.

The restraining member may be made of an electrically conductive material, and formed with a restraining portion for permitting the contact needle to come into contact with the restraining member when the contact needle is not in contact with the circuit board, and permitting the contact needle to go away from the restraining member when the contact needle bends after coming into contact with the circuit board. Further, there may be provided a connecting wire for connecting the restraining member with the electrode rod, and a detector for detecting the current in the connecting wire. The restraining portion may be formed with a hole for passing the contact needle therethrough. This construction, which is simpler, makes it possible to detect contact of the contact needle with the circuit board more accurately.

The contact needle may be entirely curved in a direction intersecting a lengthwise direction thereof. Alternatively, the contact needle may be entirely straight, and extends in a direction inclined with respect to a normal line of the circuit board. Further, the contact needle may be partially formed with a curved portion. Moreover, the contact needle may be formed with a leading end having the shape of a cone.

The inventive circuit board testing apparatus is provided with a table for supporting a circuit board to be tested, and a tester unit carrying a plurality of probe devices. Each probe device includes a holder mountable to a main body of the test unit, a contact needle attachable to the holder, and operable to resiliently bend in a specified direction immediately after coming into contact with the circuit board. This circuit board testing apparatus is provided with the inventive contact needle. Thus, accurate testing can be performed.

The probe device may be provided with a restraining member made of an electrically conductive material, and includes a restraining portion for permitting the contact needle to come into contact with the restraining member when the contact needle is not in contact with the circuit board, and permits the contact needle to bend away from the restraining member when the contact needle bends after coming into contact with the circuit board. The restraining member is connected with the contact needle by a connecting wire, and the current in the connecting wire is checked to judge the contact of the contact needle with the circuit board. This will simplify the leveling operation of contact needle.

Each of the plurality of contact needles may be made to bend in an outward direction of a space defined by the plurality of contact needles. This will prevent the plurality of contact needles from coming into contact with each other.

As this invention may be embodied in several forms without departing from the spirit of the essential characteristics thereof, the foregoing embodiments are therefore illustrative and not restrictive, since the scope of the invention is defined by the appended claims rather than by the description preceding them, and all changes that fall within the metes and bounds of the claims, or equivalence of such metes and bounds are therefore intended to be embraced by the claims.

What is claimed is:

1. A probe device for use in a circuit board testing apparatus for testing conductivity of a circuit board, the probe device comprising:
- a holder mountable to a circuit board testing apparatus, the holder including:
  - a holding member made of an electrically insulating material;
  - an electrode rod mounted in the holding member, the electrode rod extending in a direction inclined with respect to a normal line of the circuit board; and
  - a socket removably attached on the electrode rod;
- a contact needle attachable to the holder, and operable to resiliently bend in a specified direction immediately after coming into contact with a circuit board, the contact needle being fixedly attached on the socket,
- a restraining member for restraining the contact needle,
- wherein the restraining member is made of an electrically conductive material, and includes a restraining portion for permitting the contact needle to come into contact with the restraining member when the contact needle is not in contact with the circuit board, and permitting the contact needle to go away from the restraining member when the contact needle bends after coming into contact with the circuit board, further comprising:
- a connecting wire for connecting the restraining member with the electrode rod; and
- a detector for detecting the current in the connecting wire.

2. A probe device according to claim 1, wherein the restraining portion includes a hole for passing the contact needle therethrough.

3. A probe device according to claim 2, wherein the contact needle is entirely curved in a direction intersecting a lengthwise direction thereof.

4. A probe device for use in a circuit board testing apparatus for testing conductivity of a circuit board, the probe device comprising:
- a holder mounted on the testing apparatus to be driven thereby;
- a contact needle coupled with the holder to move therewith, the contact needle being made of resilient material and having a curved portion to elastically bend in a specified direction when the tip of the contact needle is depressed against the circuit board to be tested;
- a restraining member for restraining the contact needle in a manner to restrain the contact needle and prevent the movement of the contact needle while the contact needle is driven with the holder, but allow the bending of the needle when it is depressed against the circuit board; and
- wherein the restraining member having a triangular opening through which the contact needle passes in such a manner that the contact needle resiliently abuts against the restraining member at a corner of the triangular opening while the contact needle is allowed to bend opposite from the corner in the opening.

5. A probe device according to claim 4, wherein the restraining member is made of an electrically conductive material, the contact needle engages with the restraining member at the corner of the triangular opening while the contact needle is being driven and being off the restraining member when it bends, and the probe device further comprises a detector for detecting whether the contact needle engages with the restraining member.

6. A probe device according to claim 5, wherein the detector includes an electric conductor for electrically connecting the restraining member and the contact needle and a current detector for detecting the current running through the engagement between the restraining member and the contact needle by way of the electric conductor.

* * * * *